(12) United States Patent
Chi et al.

(10) Patent No.: US 11,139,284 B2
(45) Date of Patent: Oct. 5, 2021

(54) DISPLAY PANEL AND DISPLAY DEVICE HAVING AT LEAST ONE DISPLAY AREA REUSED AS A SENSOR RESERVED AREA

(71) Applicant: SHANGHAI TIANMA MICRO-ELECTRONICS CO., LTD., Shanghai (CN)

(72) Inventors: Xiao Chi, Shanghai (CN); Shaorong Yu, Shanghai (CN); Jujian Fu, Shanghai (CN)

(73) Assignee: SHANGHAI TIANMA MICRO-ELECTRONICS CO., LTD., Shanghai (CN)

( * ) Notice: Subject to any disclaimer, the term of this patent is extended or adjusted under 35 U.S.C. 154(b) by 45 days.

(21) Appl. No.: 16/731,086

(22) Filed: Dec. 31, 2019

(65) Prior Publication Data

US 2020/0312832 A1 Oct. 1, 2020

(30) Foreign Application Priority Data

Mar. 29, 2019 (CN) .......................... 201910253400.6

(51) Int. Cl.
| | |
|---|---|
| *H01L 25/18* | (2006.01) |
| *H01L 25/16* | (2006.01) |
| *H01L 27/32* | (2006.01) |
| *H01L 51/52* | (2006.01) |

(52) U.S. Cl.
CPC ............ *H01L 25/18* (2013.01); *H01L 25/167* (2013.01); *H01L 27/3218* (2013.01); *H01L 27/3225* (2013.01); *H01L 27/3234* (2013.01); *H01L 27/3269* (2013.01); *H01L 27/3276* (2013.01); *H01L 27/3279* (2013.01); *H01L 51/5253* (2013.01)

(58) Field of Classification Search
CPC ............... H01L 27/326; H01L 27/3211; H01L 27/3218; H01L 27/3225; H01L 27/3234; H01L 51/5253; H01L 51/5209; H01L 51/5225; H01L 27/3269
See application file for complete search history.

(56) References Cited

U.S. PATENT DOCUMENTS

| | | | | |
|---|---|---|---|---|
| 2017/0288004 | A1* | 10/2017 | Kim | .................... H01L 27/3276 |
| 2019/0326366 | A1* | 10/2019 | Fan | ...................... H01L 27/3218 |
| 2020/0209928 | A1* | 7/2020 | Tsai | ....................... G06F 1/1698 |
| 2020/0287162 | A1* | 9/2020 | Chung | ................ H01L 51/0097 |
| 2020/0394964 | A1* | 12/2020 | Hyun | ..................... H01L 27/326 |
| 2021/0013277 | A1* | 1/2021 | Liu | ...................... H01L 27/3218 |

FOREIGN PATENT DOCUMENTS

| | | |
|---|---|---|
| CN | 108269840 A | 7/2018 |
| CN | 108986678 A | 12/2018 |

* cited by examiner

*Primary Examiner* — Tuan A Hoang
(74) *Attorney, Agent, or Firm* — Kilpatrick Townsend & Stockton

(57) ABSTRACT

Provided are a display panel and a display device. The display panel includes a first display area and a second display area. The first display area is reused as a sensor reserved area. The first display area includes a plurality of first pixel units. The second display area includes a plurality of second pixel units. The plurality of first pixel units include micro light-emitting diode pixel units, and the plurality of second pixel units include organic light-emitting diode pixel units. The first display area at least includes a region in which density of the plurality of first pixel units in the first display area is configured to be gradually decreased along a first direction.

20 Claims, 10 Drawing Sheets

DISPLAY PANEL AND DISPLAY DEVICE HAVING AT LEAST ONE DISPLAY AREA REUSED AS A SENSOR RESERVED AREA

CROSS-REFERENCES TO RELATED APPLICATIONS

This application claims priority to Chinese patent application No. CN201910253400.6 filed on Mar. 29, 2019, disclosure of which is incorporated herein by reference in its entirety.

FIELD

Embodiments of the present disclosure relate to the field of display technologies and, in particular, to a display panel and a display device.

BACKGROUND

With the development of science and technology, more and more electronic devices with display function are widely applied to people's daily life and work, bringing great convenience to people's daily life and work, and becoming an essential important tool for people today.

The display panel is an important component of electronic devices for implementing the display function. In the present display panel, to meet the requirement of electronic devices for integrating optical electronic elements, and considering the different requirements for transparency in different areas of the screen, it is proposed to reduce the density of pixel units in the area where the optical electronic elements are disposed, to improve the transparency of the area where the optical electronic elements are disposed.

However, only reducing the pixel density in the area where the optical electronic elements are disposed may result in abrupt change of the pixel density between the normal display area and the area where the optical electronic elements are disposed, which is abrupt and has poor transition of the display effect, and thus the display effect of the display panel is affected.

SUMMARY

In view of the above, embodiments of the present disclosure provide a display panel and a display device, to solve the problem in the related art that the pixel density between a normal display area and an area where optical electronic elements are disposed is abruptly changed due to low pixel density of the area where optical electronic elements are disposed, and the transition of the display effect is poor.

In one embodiments of the present disclosure provide a display panel, including a first display area and a second display area. The first display area is reused as a sensor reserved area. The first display area includes a plurality of first pixel units. The second display area includes a plurality of second pixel units. The plurality of first pixel units include micro light-emitting diode pixel units, and the plurality of second pixel units include organic light-emitting diode pixel units. A density of the plurality of first pixel units in the first display area is configured to be gradually decreased along a first direction, and the first direction is a direction in which the second display area points to the first display area.

In another embodiments of the present disclosure further provide a display device including the display panel described in the previous embodiment.

BRIEF DESCRIPTION OF DRAWINGS

Embodiments of the disclosure will be described with reference to the drawings.

DETAILED DESCRIPTION

Figure 1:
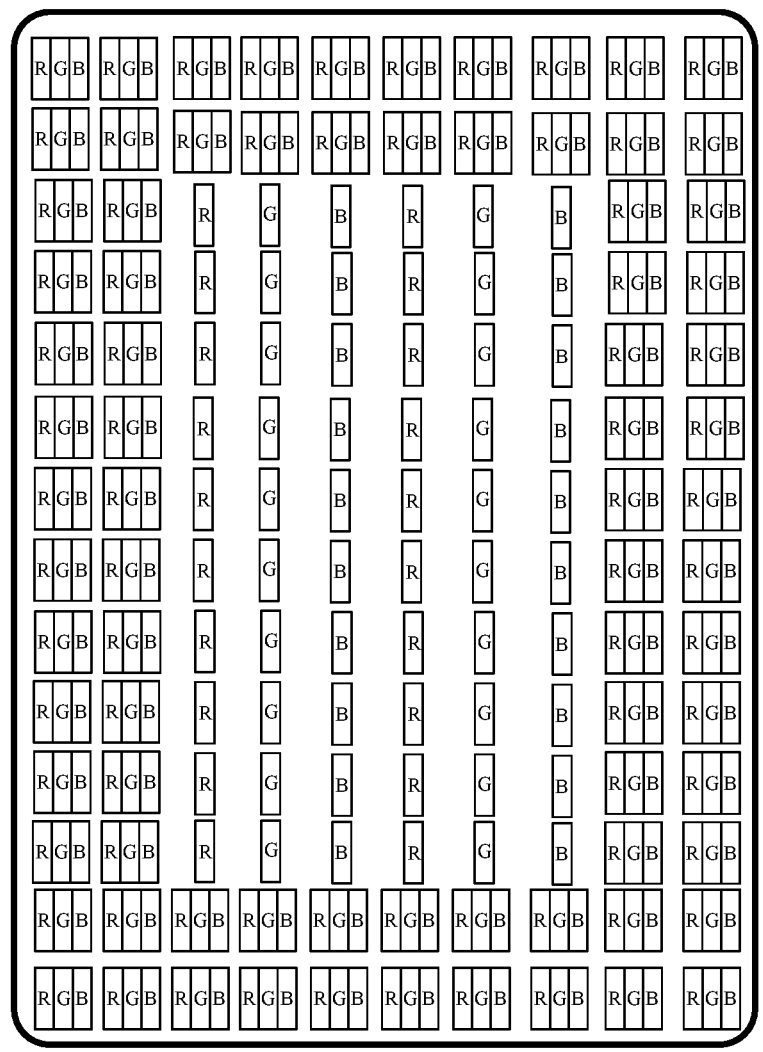
FIG. 1 is a structural view of a display panel in the related art.

FIG. 1 is a structural view of a display panel in the related art. As shown in FIG. 1, to avoid the phenomenon in which full-screen display cannot be achieved due to the arrangement of a hollowed-out area in the display panel and the arrangement of an optical electronic element in the hollowed-out area, what the related art proposes in view of the transparency requirements of different areas of the display panel is to reduce the pixel density in the area provided with an optical electronic element to increase the transparency of the area provided with an optical electronic element.

However, the pixel density in the area provided with an optical electronic element is relatively low, resulting in an abrupt change of the pixel density between the normal display area and the area provided with an optical electronic element. This abrupt change causes a user to easily see the boundary between different areas and thus results in a poor transition that affects the display effect of the display panel.

Embodiments of the present disclosure provide a display panel. The display panel includes a first display area and a second display area. The first display area is reused as a sensor reserved area. The first display area includes a plurality of first pixel units. The second display area includes a plurality of second pixel units. The plurality of first pixel units include micro light-emitting diode pixel units, and the plurality of second pixel units include organic light-emitting diode pixel units. The density of the plurality of first pixel units in the first display area gradually decreases along a first direction. In some embodiments, the plurality of first pixel units in the first display area include micro light-emitting diode pixel units, and the first display area is reused as a sensor reserved area. Due to the light emission characteristic of micro light-emitting diodes, a normal displaying may be achieved in the area in which displaying is originally abnormal due to the arrangement of a sensor. Meanwhile, a small area is covered by the micro light-emitting diode pixel units, ensuring that the first display area has a light-transmitting area and the sensor receives optical signals through the light-transmitting area so that the sensor can be normally used. Further, the density of the plurality of first pixel units in the first display area gradually decreases, so that in the first display area gradually increases, the first display area has a relatively large light-transmitting area, and thus the first display area has a good light transmission effect. Meanwhile, a transition area from the second display area to the first display area is configured at least in such manner that the density of the plurality of first pixel units gradually decreases, to ensure that the transition from the second display area to the first display area is smooth, avoiding an abrupt transition caused by the abrupt change of the pixel unit density between the second display area and the first display area, and thus ensuring the good display effect of the display panel.

Figure 2:
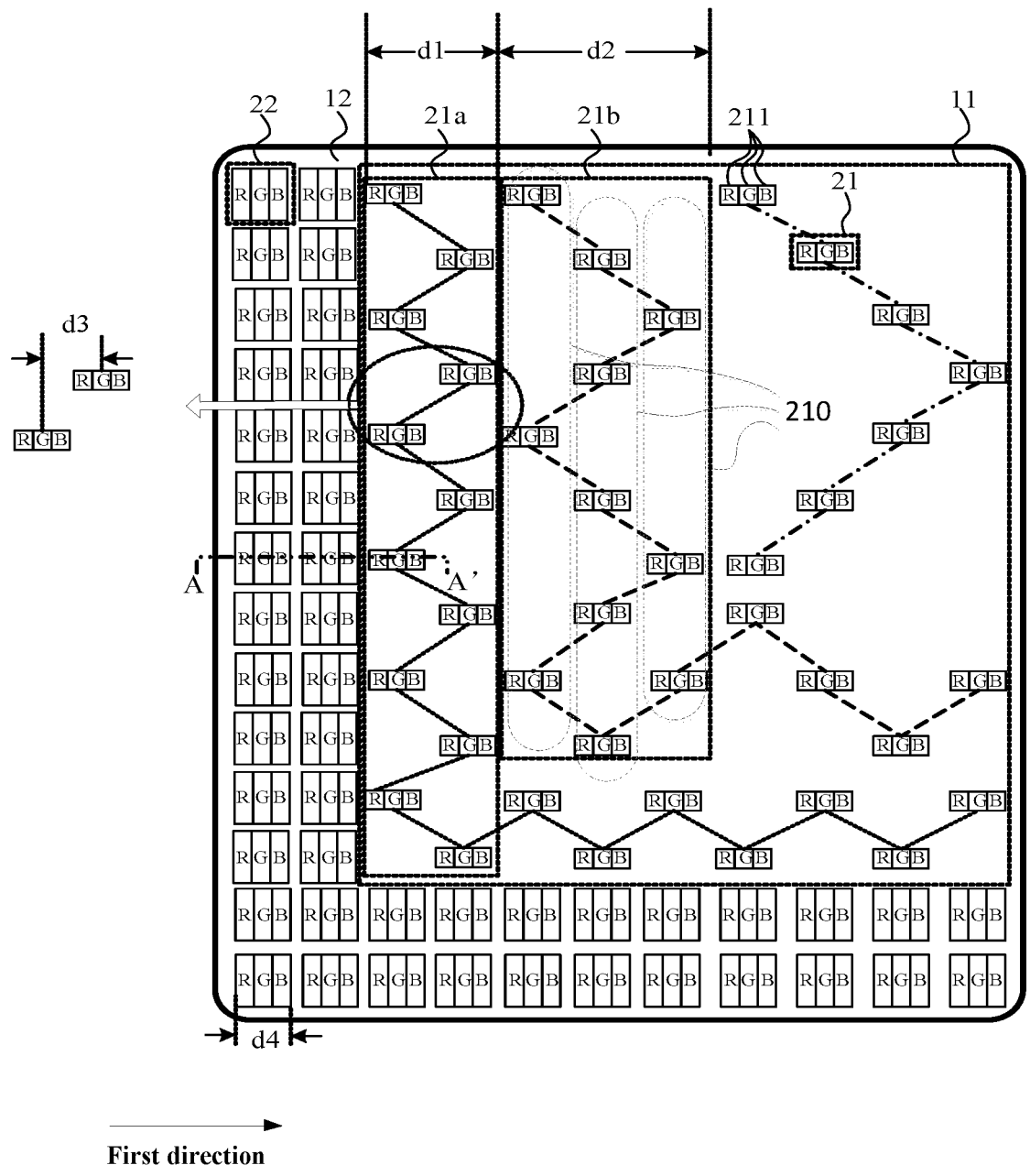
FIG. 2 is a structural view of another display panel according to embodiments of the present disclosure.

FIG. 2 is a structural view of a display panel according to embodiments of the present disclosure. As shown in FIG. 2, the display panel according to embodiments of the present disclosure may include a first display area 11 and a second display area 12, and the first display area 11 is reused as a sensor reserved area.

The first display area 11 includes a plurality of first pixel units 21, the second display area 12 includes a plurality of second pixel units 22, the plurality of first pixel units 21 include micro light-emitting diode (Micro LED) pixel units, and the plurality of second pixel units 22 include organic light-emitting diode (OLED) pixel units.

The density of the plurality of first pixel units 21 in the first display area 11 gradually decreases; and the first direction is a direction in which the second display area 12 points to the first display area 11.

By way of example, the Micro LED is different from the conventional LED in size, and the grain size of a typical LED is 200-300 μm while the grain size of Micro LED is 15 μm or less. In this embodiment, the first display area 11 includes a plurality of Micro LEDs, and based on the display characteristic of the Micro LED, normal displaying is ensured in the first display area 11. Meanwhile, based on the size characteristic of the Micro LED, the first display area 11 is configured as a sensor reserved area. Since the Micro LED is small in size, the first display area 11 includes a light-transmitting area in addition to the light-emitting area, so that the sensor on the non-light-emitting side of the display panel can receive optical signals through the light-transmitting area, and the sensor can be normally used.

Although the sensor can receive an optical signal through the light-transmitting area, since the conventional display products generally require a greater pixel resolution, and a higher pixel density in the display area of the display panel is required. The pixel density can be understood as the number of pixels included in a unit display area. Therefore, when the pixel unit density of the plurality of first pixel units 21 is the same as the pixel unit density of the plurality of second pixel unit 22, the area of the light-transmitting area in the first display area 11 is smaller, and the light transmittance of the first display area 11 is reduced, which affects the use effect of the sensor, for example, the photographing effect of the camera. On this basis, in this embodiment, as shown in FIG. 2, along the first direction, at least one area where the density of the plurality of first pixel units gradually decreases exists in the plurality of first pixel units 21, so that the first display area 11 is configured at least in such manner that the light-transmitting area gradually increases, ensuring that the first display area 11 has a relatively large light-transmitting area and a good light transmission effect. Meanwhile, a transition area from the second display area 12 to the first display area 11 is configured at least in such manner that the density of the plurality of first pixel units gradually decreases, to ensure that the transition from the second display area 12 to the first display area 11 is smooth, avoiding an abrupt transition caused by the abrupt change of the pixel unit density between the second display area 12 and the first display area 11, and thus ensuring the good display effect of the display panel.

It should be noted that, since the relative positional relationship between the first display area 11 and the second display area 12 is not limited in embodiments of the present disclosure, the first display area 11 may be located at any position of the second display area 12. For example, the first display area 11 is located at one side or both sides of the second display area 12; the first display area 11 may be located inside the second display area 12, and the like, and the position of the first display area 11 may be configured according to the setting of the sensor position, which is not limited in the present embodiments.

It should be noted that, since the relative positional relationship between the first display area 11 and the second display area 12 is not limited in embodiments of the present disclosure, the first direction in embodiments of the present disclosure is not unique. By way of example, when the first display area 11 is located inside the second display area 12, all directions from the outer side where the second display area 12 is located to the inner side where the first display area 11 is located may be understood as the first direction. FIG. 2 uses an example in which the first direction is the direction in which the second display area 12 located on the left side of the first display area 11 points to the first display area 11.

In conclusion, according to the display panel provided by the present disclosure, the plurality of first pixel units in the first display area include micro light-emitting diode pixel units, the plurality of second pixel units in the second display area include organic light-emitting diode pixel units, and the first display area is reused as a sensor reserved area. Due to the light emission characteristic of micro light-emitting diodes, a normal displaying is achieved in the area in which displaying is originally abnormal due to the arrangement of a sensor. Meanwhile, a small area is covered by the micro light-emitting diode pixel units, ensuring that the first display area has a light-transmitting area and the sensor receives optical signals through the light-transmitting area so that the sensor can be normally used. Further, the first display area is configured at least in such manner that the density of the plurality of first pixel units in the first display area is configured to be gradually decreased, so that the first display area is configured at least in such manner that the light-transmitting area gradually increases, the first display area has a relatively large light-transmitting area, and thus the first display area has a good light transmission effect. Meanwhile, a transition area from the second display area to the first display area is configured at least in such manner that the density of the plurality of first pixel units gradually decreases, to ensure that the transition from the second display area to the first display area is smooth, avoiding an abrupt transition caused by the abrupt change of the pixel unit density between the second display area and the first display area, and thus ensuring the good display effect of the display panel.

In one embodiment, various implementation modes may be adopted for configuring, the density of the plurality of first pixel units in the first display area to be gradually decreased along the first direction. These implementation modes will be described in detail below.

Still referring to FIG. 2, the first display area 11 includes a first pixel unit column 21a and a second pixel unit column 21b, and the second pixel unit column 21b is located on one side of the first pixel unit column 21a facing away from the second display area 12. The first pixel unit column 21a and the second pixel unit column 21b extend along a second direction, and the second direction intersects the first direction.

Along the second direction, each of the first pixel unit column 21a and the second pixel unit column 21b includes the plurality of first pixel units 21 arranged in a polyline pattern; adjacent two rows of the plurality of first pixel units are staggered by a first preset distance d3 along the first direction.

Along the first direction, an extension width of the first pixel unit column is d1, and an extension width of the second pixel unit column is d2, and d1<d2.

FIG. 2 uses an example in which the first direction is the direction in which the second display area 12 located on the left side of the first display area 11 points to the first display area 11. Meanwhile, all directions intersecting the first direction may be understood as the second direction. FIG. 2 only uses an example in which the first direction is perpendicular to the second direction. Moreover, the pixel unit column may be understood as a plurality of pixel units arranged in a polyline pattern along the second direction, and the pixel unit column extends along the second direction.

Exemplarily, as shown in FIG. 2, the first pixel unit column 21a and the second pixel unit column 21b both extend along the second direction. Along the first direction, the extension width of the first pixel unit column 21a is d1, and the extension width of the second pixel unit column 21b is d2, and d1<d2. In one embodiment, the extension width d1 of the first pixel unit column 21a can be understood as the distance between the straight line where the edge of the side, adjacent to the second display area 12, of the first pixel units 21 closest to the second display area 12 in the first pixel unit column 21a locates and the straight line where the edge of the side, facing away from the second display area 12, of the first pixel units 21 farthest from the second display area 12 in the first pixel unit column 21a locates. Similarly, the extension width d2 of the second pixel unit column 21b can be understood as the distance between the straight line where the edge of the side, adjacent to the second display area 12, of the first pixel units 21 closest to the second display area 12 in the second pixel unit column 21b locates and the straight line where the edge of the side, backing onto the second display area 12, of the first pixel units 21 farthest from the second display area 12 in the second pixel unit column 21b locates. The extension width d1 of the first pixel unit column 21a and the extension width d=2 of the second pixel unit column 21b along the first direction are configured to satisfy d1<d2, so that the first display area is configured at least in such manner that density of the plurality of first pixel units gradually decreases. It can be understood that the extension width d2 of the second pixel unit column 21b backing onto the second display area 12 along the first direction is greater than the extension width d1 of the first pixel unit column 21a adjacent to the second display area 12 along the first direction. The area of the light-transmitting area in the area where the second pixel unit column 21b is located is greater than the area of the light-transmitting area in the area where the first pixel unit column 21a is located. Therefore, the first display area 11 is ensured to have at least a light-transmitting area which gradually increases, where the light-transmitting area is described as a non-light-emitting area among the plurality of first pixel units 21, and the first display area 11 has a good light transmission effect. Meanwhile, a transition area from the second display area 12 to the first display area 11 is configured at least in such manner that the density of the plurality of first pixel units gradually decreases, to ensure that the transition from the second display area 12 to the first display area 11 is smooth, avoiding an abrupt transition caused by the abrupt change of the pixel unit density between the second display area 12 and the first display area 11, and thus ensuring the good display effect of the display panel.

Still referring to FIG. 2, two adjacent rows of pixels are staggered along the first direction by a first preset distance d3, and d3=d4 is satisfied between the first preset distance d3 and an extension width d4 of one of the plurality of second pixel units 22 along the first direction. In one embodiment, the first preset distance d3 may be understood as a distance between axes respectively passing through geometric centers of two adjacent rows of pixel units along the second direction, and the extension width d4 of one of the plurality of second pixel unit 22 along the first direction may be understood as a distance between an edge, adjacent to the first display area 11, of one of the plurality of second pixel units 22 and an edge backing onto the first display area 11 along the first direction. The first preset distance d3 and the extension width d4 of one of the plurality of second pixel units 22 along the first direction are configured to satisfy d3=d4, and each pixel unit column includes a plurality of pixel units arranged in a polyline pattern along the second direction. Therefore, blank rows and blank columns do not exist in the first pixel unit column 21a and the second pixel unit column 21b, a blank display area does not exist in the first display area 11 during display, and a good display effect of the first display area 11 is ensured.

It should be noted that when the first pixel unit column 21a and the second pixel unit column 21b both include a plurality of first pixel units 21 arranged in a polyline pattern, and the first pixel unit column 21a and the second pixel unit column 21b are configured to display, each of the first pixel unit column 21a and the second pixel unit column 21b may include a plurality of data lines arranged in straight lines. As shown in FIG. 2, the first pixel unit column 21a corresponds to two data lines, and the second pixel unit column 21b corresponds to three data lines.

In one embodiment, each pixel unit column of the plurality of pixel unit columns includes N sub pixel unit columns, and the N sub pixel unit columns extend along the second direction. In one embodiment, N is a positive integer greater than or equal to 2.

In one embodiment, the first pixel unit column includes N1 sub pixel unit columns, the second pixel unit column includes N2 sub pixel unit columns, and where N2 is greater than N1. Still referring to FIG. 2, the second pixel unit column 21b includes three sub pixel unit columns 210, the first pixel unit column 21a includes two sub pixel unit columns (not shown in drawings). This embodiment only shows some of the embodiments, but the present disclosure is not limited to these.

In one embodiment, different sub pixel unit columns in the same pixel unit column are electrically connected to different signal lines.

In one embodiment, the first pixel unit column is electrically to N1 data lines, the second pixel unit column is electrically to N2 data lines, and one of data lines is electrically connected to a respective one of the N sub pixel unit columns. It should be noted that, the signal lines include data lines or scanning lines, the specific connection signal is set according to actual requirements.

In one embodiment, along the second direction, the N sub pixel unit columns in the same pixel unit column share one of the signal lines with the plurality of second pixel units in the second display area.

In one embodiment, the first pixel units in the pixel unit column are arranged in the polyline pattern, and the first pixel units in each of the N sub pixel unit columns are arranged along a straight line in the second direction. Still referring to FIG. 2, the sub pixel unit columns 210 extend along the second direction, the first pixel units in the sub pixel unit columns 210 are arranged along a straight line in the second direction, and the first pixel units in the pixel unit columns are arranged in the polyline pattern.

In one embodiment, each pixel unit column includes a plurality of pixel units arranged in a polyline pattern, FIG. 2 exemplarily shows multiple polylines composed of dashed lines. These polylines composed of dashed lines are merely used to visually show that the plurality of pixel units are arranged in a polyline pattern and are not-intended to show that the pixel units are connected to each other. Similarly, in the following drawings, the polylines composed of dashed lines are used to show that the pixel units are arranged in a polyline pattern. This will not be explained in the following description.

Figure 3:
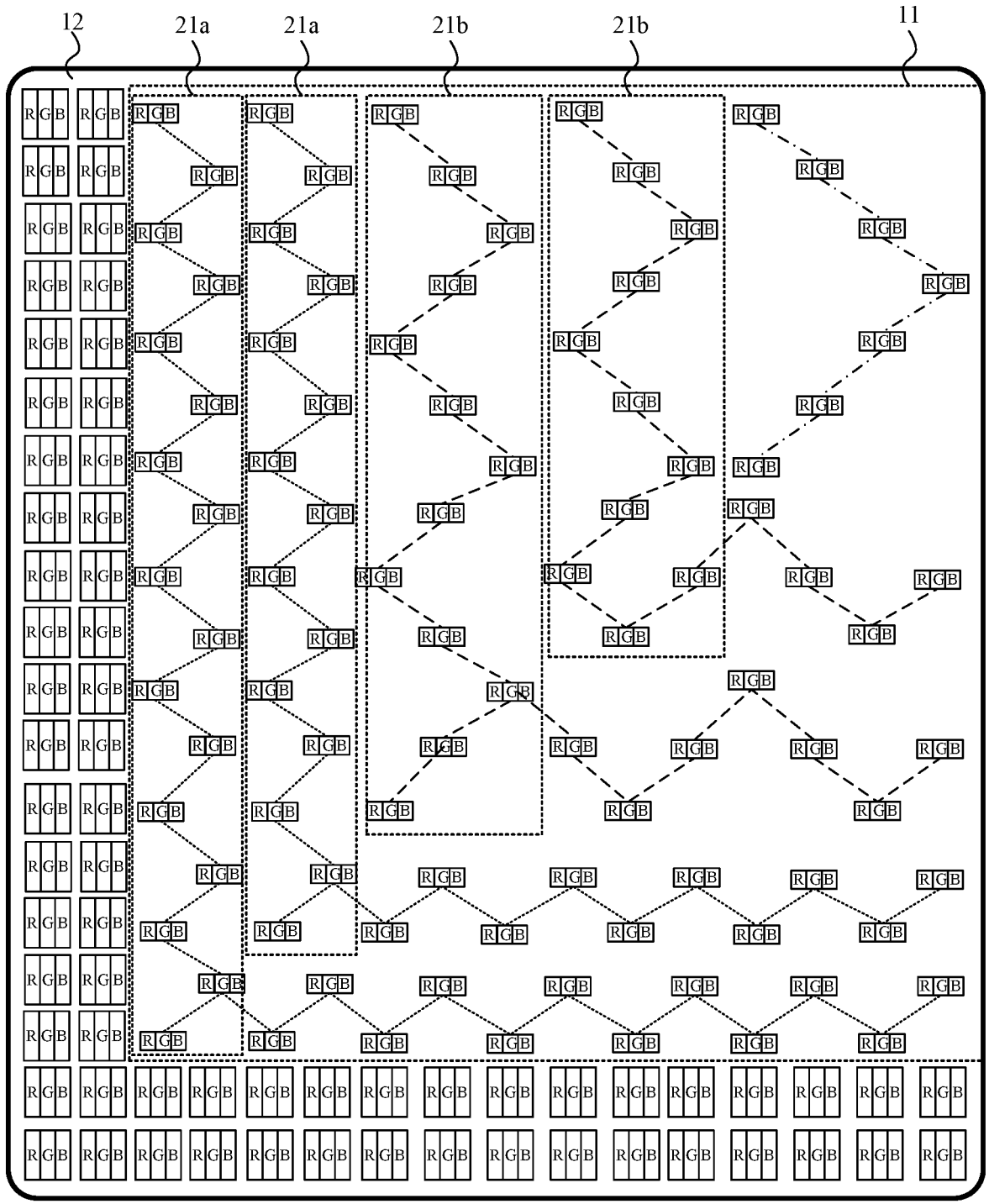
FIG. 3 is a structural view of another display panel according to embodiments of the present disclosure.

FIG. 3 is a structural view of another display panel according to embodiments of the present disclosure. As shown in FIG. 3, the first display area 11 includes at least two first pixel unit columns 21a and at least two second pixel unit columns 21b in sequence along the first direction.

FIG. 3 uses an example in which the first direction is the direction in which the second display area 12 located on the left side of the first display area 11 points to the first display area 11. Meanwhile, FIG. 3 uses an example in which the first display area 11 includes two first pixel unit columns 21a and two second pixel unit columns 21b in sequence along the first direction. As shown in FIG. 3, the first display area 11 includes at least two of first pixel unit columns 21a and at least two of second pixel unit columns 21b in sequence. Meanwhile, along the first direction, the extension width d1 of the first pixel column 21a and the extension width d2 of the second pixel unit column 21b satisfy d1<d2. Therefore, the density of the plurality of first pixel units in first display area 11 is configured to be gradually decreased, ensuring that the first display area 11 is configured at least in such manner that the light-transmitting area gradually increases, and the first display area 11 has a good light transmission effect. Meanwhile, a transition area from the second display area 12 to the first display area 11 is configured at least in such manner that the density of the plurality of first pixel units gradually decreases, to ensure that the transition from the second display area to the first display area is smooth, avoiding an abrupt transition caused by the abrupt change of the pixel unit density between the second display area and the first display area, and thus ensuring the good display effect of the display panel.

Figure 4:
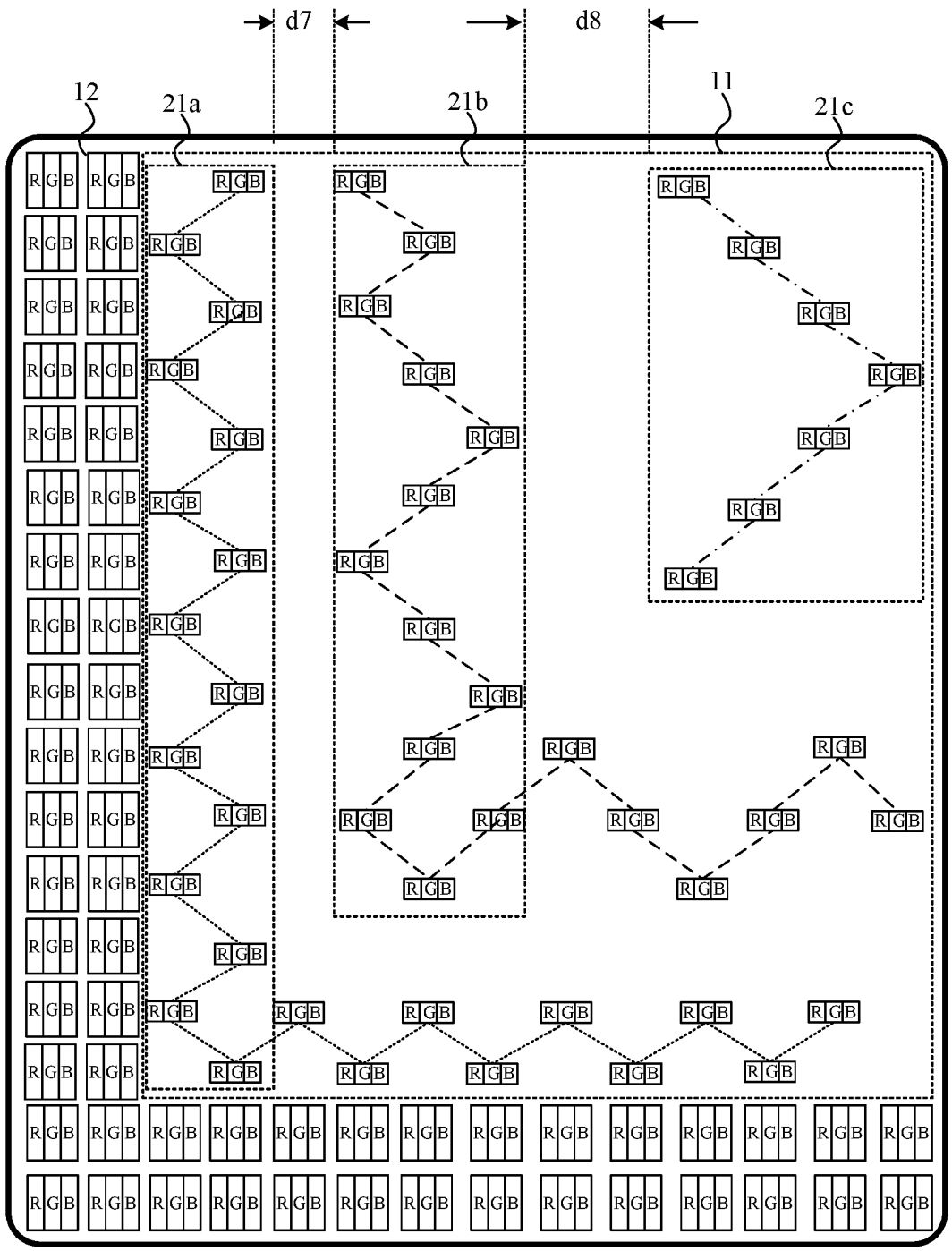
FIG. 4 is a structural view of another display panel according to embodiments of the present disclosure.

FIG. 4 is a structural view of another display panel according to embodiments of the present disclosure. As shown in FIG. 4, the first display area 11 may include a plurality of pixel unit columns, and distances between adjacent two pixel unit columns in the plurality of pixel unit columns gradually increase along the first direction.

FIG. 4 uses an example in which the first direction is the direction in which the second display area 12 located on the left side of the first display area 11 points to the first display area 11. Meanwhile, FIG. 4 uses an example in which the first display area 11 includes the first pixel unit column 21a, the second pixel unit column 21b and the third pixel unit column in sequence along the first direction. As shown in FIG. 4, along the first direction, a distance d7 between the first pixel unit column 21a and the second pixel unit column 21b and a distance d8 between the second pixel unit column 21b and the third pixel unit column 21c satisfy d7<d8. In one embodiment, along the first direction, the distance between the first pixel unit column 21a and the second pixel unit column 21b may be understood as the distance between the straight line where the edge of the side, adjacent to the second pixel unit column 21b, of the first pixel unit 21 closest to the second pixel unit column 21b in the first pixel unit column 21a locates and the straight line where the edge of the side, adjacent to the first pixel unit column 21a, of the first pixel unit 21 closest to the first pixel unit column 21a in the second pixel unit column 21b locates. Similarly, the distance between the second pixel unit column 21b and the third pixel unit column 21c can be understood as the distance between the straight line where the edge of the side, adjacent to the third pixel unit column 21c, of the first pixel unit 21 closest to the third pixel unit column 21c in the second pixel unit column 21b locates and the straight line where the edge of the side, adjacent to the second pixel unit column 21b of the first pixel unit 21 closest to the second pixel unit column 21b in the third pixel unit column 21c locates. In the first direction, the distance d7 between the first pixel unit column 21a and the second pixel unit column 21b and the distance d8 between the second pixel unit column 21b and the third pixel unit column 21c are configured to satisfy d7<d8. Therefore, the first display area 11 is configured at least in such manner that density of the plurality of first pixel units gradually decreases, ensuring that the first display area 11 is configured at least in such manner that the light-transmitting area gradually increases, and the first display area 11 has a good light transmission effect. Meanwhile, a transition area from the second display area 12 to the first display area 11 is configured at least in such manner that the density of the plurality of first pixel units gradually decreases, to ensure that the transition from the second display area to the first display area is smooth, avoiding an abrupt transition caused by the abrupt change of the pixel unit density between the second display area and the first display area, and thus ensuring the good display effect of the display panel. FIG. 4 uses an example in which the extension widths of the first pixel unit column 21a, the second pixel unit column 21b, and the third pixel unit column 21c gradually increase along the first direction. It is understood that, along the first direction, the extension widths of the first pixel unit column 21a, the second pixel unit column 21b, and the third pixel unit column 21c are kept constant and the distance d7 between the first pixel unit column 21a and the second pixel unit column 21b and the distance d8 between the second pixel unit column 21b and the third pixel unit column 21c are configured to satisfy d7<d8, which also ensures that at least the pixel unit density of the first display area 11 gradually decreases along the first direction, and the description is not repeated here.

Figure 5:
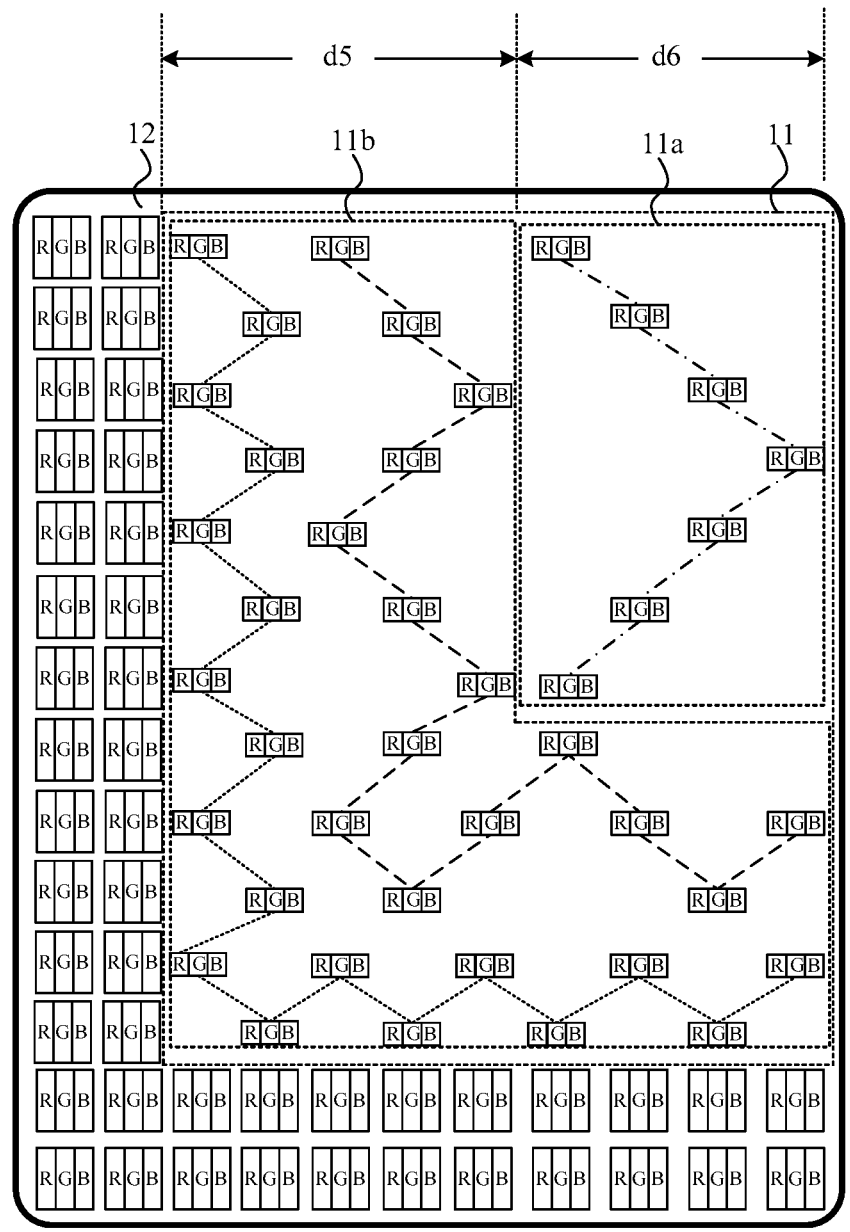
FIG. 5 is a structural view of another display panel according to embodiments of the present disclosure.

FIG. 5 is a structural view of another display panel according to embodiments of the present disclosure. As shown in FIG. 5, the first display area 11 may include a pixel unit density fixing area 11a backing onto the second display area 12.

The pixel unit density fixing area has a uniform pixel unit density, and the pixel unit density of the pixel unit density fixing area is smaller than pixel unit density of the second display area.

By way of example, the first display area 11 may further include a pixel unit density fixing area 11 spaced apart from the second display area 12, and the pixel unit density fixing area 11a may be reused as a sensor reserved area. The pixel unit density of the pixel unit density fixing area 11a is kept constant and is less than the pixel unit density of the second display area 12. Therefore, the pixel unit density of the pixel unit density fixing area 11a can meet the pixel unit density required by normal display and the light transmittance required by lighting of the sensor, the pixel unit density fixing area 11a can display normally, and the pixel unit density fixing area 11a has good light transmittance effect.

Still referring to FIG. 5, the first display area 11 may further include a pixel unit transition area 11b located between the pixel unit density fixing area 11a and the second display area 12.

Along the first direction, an extension width of the pixel unit transition area is d5, and an extension width of the pixel unit density fixing area is d6, and 0.01≤d5/d6≤100.

By way of example, FIG. 5 uses an example in which the first direction is the direction in which the second display area 12 located on the left side of the first display area 11 points to the first display area 11. The pixel unit transition area 11b may include at least two of pixel unit columns with pixel cell densities gradually decreasing along the first direction, as shown in FIG. 5. Along the first direction, an extension width of the pixel unit transition area is d5, and an extension width of the pixel unit density fixing area is d6, and 0.01≤d5/d6≤100. In one embodiment, the extension width d5 of the pixel unit transition area 11b can be understood as the distance between the straight line where the edge of the side, adjacent to the second display area 12, of the first pixel units 21 closest to the second display area 12 in the pixel unit transition area 11b locates and the straight line where the edge of the side, facing away from the second display area 12, of the first pixel units 21 farthest from the second display area 12 in the pixel unit transition area 11b locates. Similarly, the extension width d6 of the pixel unit density fixing area 11a can be understood as the distance between the straight line where the edge of the side, adjacent to the second display area 12, of the first pixel units 21 closest to the second display area 12 in the pixel unit density fixing area 11a locates and the straight line where the edge of the side, backing onto the second display area 12, of the first pixel units 21 farthest from the second display area 12 in the pixel unit density fixing area 21b locates. The proportional relation between the extension width d5 of the pixel unit transition area 11b and the extension width d6 of the pixel unit density fixing area 11a is reasonably configured, so that the display effect of the display panel can be ensured, the pixel unit density fixing area 11a can be ensured to have higher light transmittance, and the sensor can be ensured to receive enough light rays to normally work.

Figure 6:
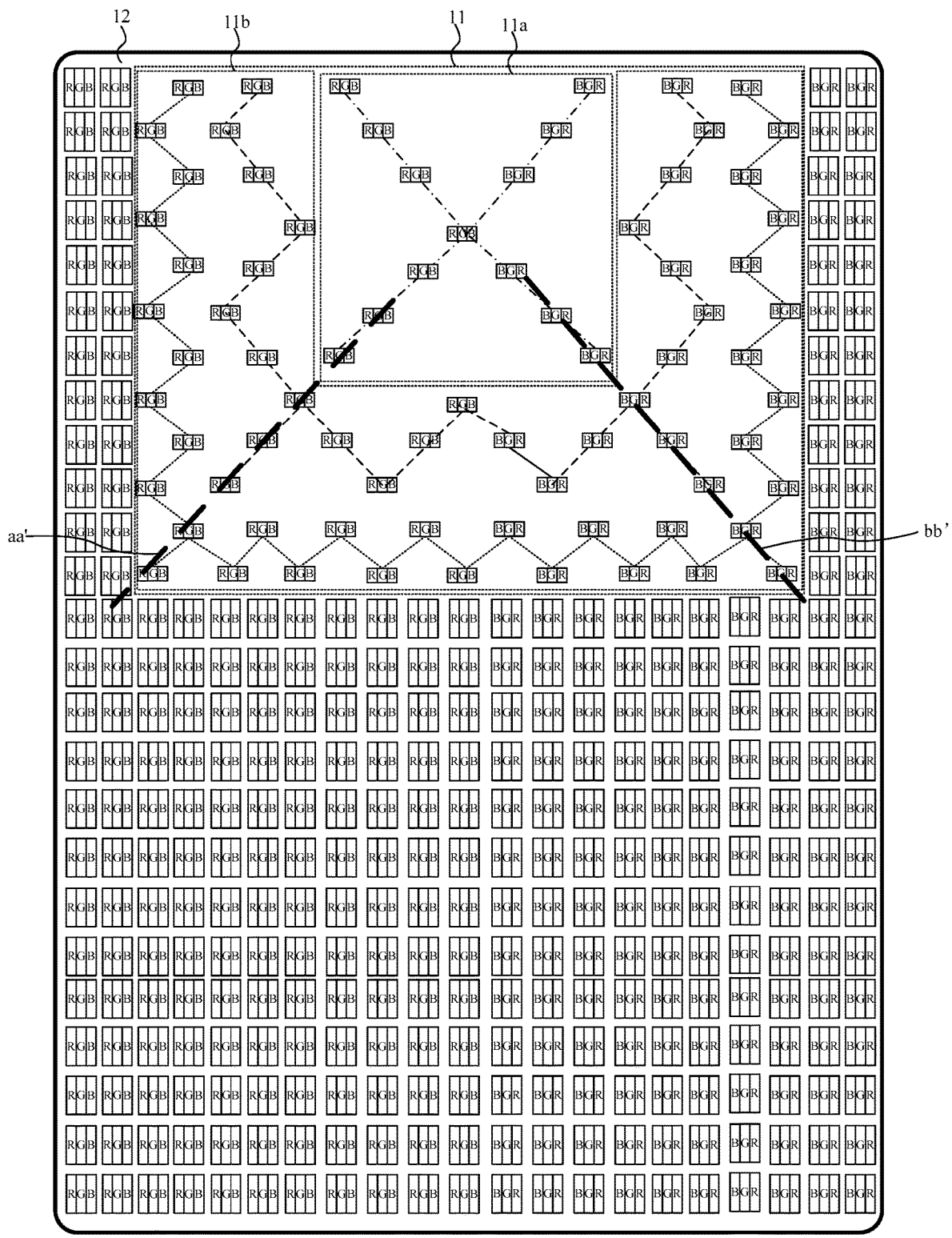
FIG. 6 is a structural view of another display panel according to embodiments of the present disclosure.

FIG. 6 is a structural view of another display panel according to embodiments of the present disclosure. FIG. 6 uses an example in which the second display area 12 surrounds the pixel unit transition area 11b, and the pixel unit transition area 11b includes the pixel unit density fixing area 11a. As shown in FIG. 6, in an actual display panel, a first display area 11 may be disposed at a middle position of an upper end of the display panel, a second display area 12 may be disposed around the first display area 11, and a pixel unit density fixing area 11a may be reused as a sensor reserved area. As shown in FIG. 6, the pixel unit density of the pixel unit transition area 11b is between the pixel unit density of the pixel unit density fixing area 11a and the pixel unit density of the second display area 12. Therefore, the natural transition between the second display area 12 and the first display area 11 is ensured, the problem of abrupt transition caused by different pixel unit types and different pixel unit densities in the first display area 11 and the second display area 12 is avoided and the display effect of the display panel is improved.

Still referring to FIG. 6, as shown by the line aa' and the line bb', in the pixel unit transition area 11b, the pixel units on both sides of the line aa' are symmetrical with respect to the line aa', and the pixel units on both sides of the line bb' are symmetrical with respect to the line bb'. Therefore, the pixel unit transition area 11b is completely consistent in any direction of the transition from the second display area 12 to the first display area 11, to ensure good transition of the display panel and good display effect of the display panel.

Figure 7:
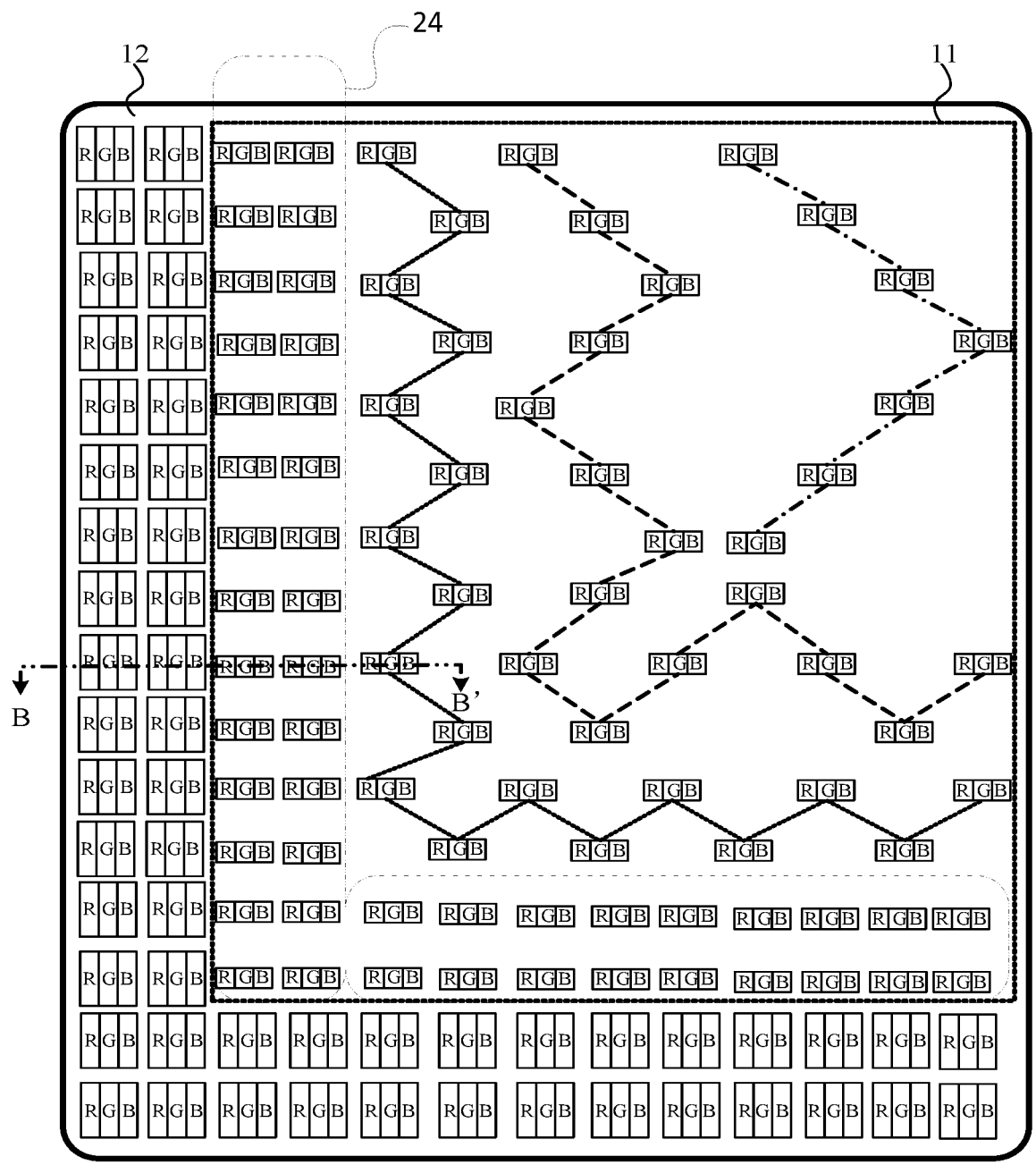
FIG. 7 is a structural view of another display panel according to embodiments of the present disclosure.

FIG. 7 is a structural view of another display panel according to embodiments of the present disclosure. As shown in FIG. 7, the pixel unit density of the first display area 11 adjacent to the second display area 12 is the same as the pixel unit density of the second display area 12.

Still referring to FIG. 7, the pixel unit density of the pixel units disposed on one side of the first display area 11 adjacent to the second display area 12 are the same as the pixel unit density of the pixel units disposed in the second display area 12. The case shown in FIG. 7 may be understood as follows. The pixel unit density of the pixel units disposed a region 24 of the first display area 11 adjacent to the second display area 12 is configured to be the same as the pixel unit density of the pixel units disposed in the second display area 12, the pixel units disposed in a region of the first display area 11 adjacent to the second display area 12 are of the same type as the remaining pixel units of the first display area 11, and the pixel units are all Micro LED pixel units. Based on above configuration, when the displayed image is transited from the second display area 12 to the side of the first display area 11 adjacent to the second display area 12 during the display panel is in a display state, the pixel unit density of the first display area 11 adjacent to the second display area 12 is the same as the pixel unit density of the second display area 12, so that the display difference caused by different pixel unit types can be alleviated. When the displayed image is transited from one side adjacent to the second display area 12 to one side backing onto the second display area 12, the display difference caused by different pixel unit densities can be alleviated due to the same pixel unit types, the whole display panel is ensured to be naturally transited in different display areas, the problem that the transition is abrupt due to different pixel unit types of the first display area 11 and the second display area 12 and different pixel unit densities is avoided, and the display effect of the display panel is improved.

In conclusion, the density of the first pixel units in the first display area 11 gradually decreases, so that the first display area 11 is ensured to have at least a light-transmitting area which gradually increases, and the first display area has a good light transmission effect. Meanwhile, a transition area from the second display area 12 to the first display area 11 is configured at least in such manner that the density of the plurality of first pixel units gradually decreases, to ensure that the transition from the second display area 12 to the first display area 11 is smooth, avoiding an abrupt transition caused by the abrupt change of the pixel unit density between the second display area 12 and the first display area 11, and thus ensuring the good display effect of the display panel.

Figure 8:
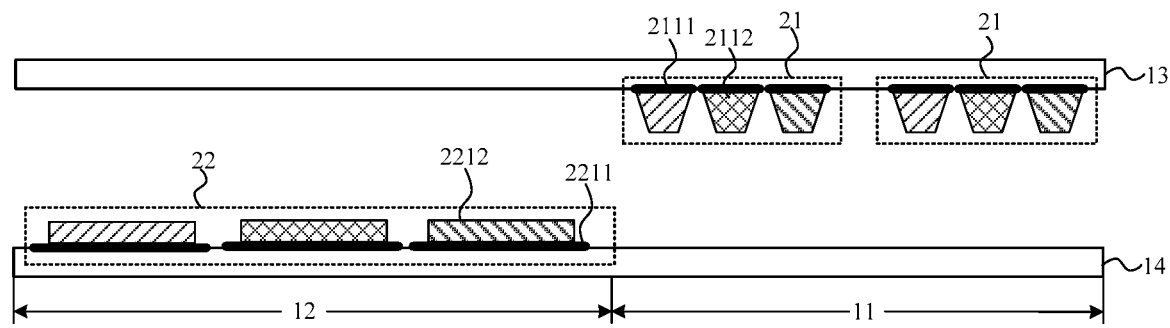
FIG. 8 is a cross-sectional view taken along a section line A-A' of the display panel shown in FIG. 2.

FIG. 8 is a cross-sectional view of a display panel shown in FIG. 2 taken along a section line A-A'. As shown in FIG. 8, the display panel provided by the present disclosure may further include a first substrate 13 and a second substrate 14. In the first display area 11, a first driving circuit 2111 and a plurality of Micro LEDs 2112 are disposed on one side of the first substrate 13 facing to the second substrate 14 and on one side of the second substrate 14 facing to the first substrate 13, and the first driving circuit 2111 is used for driving the plurality of Micro LEDs 2112 to emit light. In the second display area 12, a second driving circuit 2211 and a plurality of OLEDs 2212 are disposed on one side of the second substrate 14 facing to the first substrate 13 and the second driving circuit 2211 is used for driving the plurality of OLEDs 2212 to emit light.

Exemplarily, the first driving circuit 2111 is disposed on the side of the first substrate 13 facing to the second substrate 14 or on the side of the second substrate 14 facing to the first substrate 13. FIG. 8 uses an example in which only the first driving circuit 2111 is disposed on the side of the first substrate 13 facing to the second substrate 14. In the second display area 12, a second driving circuit 2211 and a plurality of OLEDs 2212 are disposed on one side of the second substrate 14 facing to the first substrate 13. The second driving circuit 2211 may include a plurality of film transistors and a plurality of capacitor structures, for example, the second driving power may be a 7T1C circuit, that is, a circuit including 7 film transistors and 1 capacitor. Embodiments of the present disclosure do not limit the specific type of the second driving circuit 2211, and only that the second driving circuit 2211 can drive the OLEDs to normally display is ensured.

In some embodiments of the present disclosure, the first substrate and the second substrate may be both flexible substrates, and the first pixel unit 21 and the third pixel unit 23 may be located on one side surface of the second substrate backing onto the first substrate, and the first pixel unit 21 and the third pixel unit 23 may be attached on one side surface of the second substrate on which the components are not disposed and on a light-emitting surface side of the first substrate. Therefore, the adhesive material may not be disposed on the surfaces of the first pixel unit 21 and the third pixel unit 23, which is advantageous for heat dissipation of the first pixel unit 21 and the third pixel unit 23. And in some embodiments of the present disclosure, the area of the second substrate, that is, the substrate provided with the first pixel unit and the third pixel unit, may be smaller than the area of the first substrate. Since the second substrate is only used as a carrier substrate for the first pixel unit and the third pixel unit, the second substrate may be sized to cover the first display area and the pixel unit transition area.

Figure 9:
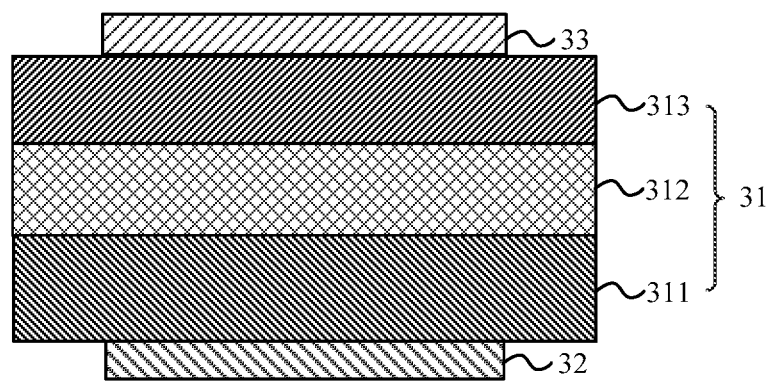
FIG. 9 is a structural view of a Micro LED according to embodiments of the present disclosure.

FIG. 9 is a structural view of a Micro LED provided in embodiments of the present disclosure. As shown in FIG. 9, the Micro LED provided by the present disclosure may be a vertical Micro LED. The vertical Micro LED includes an LED semiconductor structure 31 and first and second electrodes 32 and 33 located at opposite sides of the LED semiconductor structure 31. The LED semiconductor structure 31 includes a first type semiconductor layer 311, an active layer 312 and a second type semiconductor layer 313 which are stacked. The specific material and structure of the Micro LED structure are not limited in the present embodiments. Therefore, the materials of the first type semiconductor layer 311, the active layer 312 and the second type semiconductor layer 313 are not specifically limited, and may be gallium nitride or gallium arsenide, and different materials are selected according to different light colors of different Micro LEDs, which will not be described in detail in the present embodiments.

Figure 10:
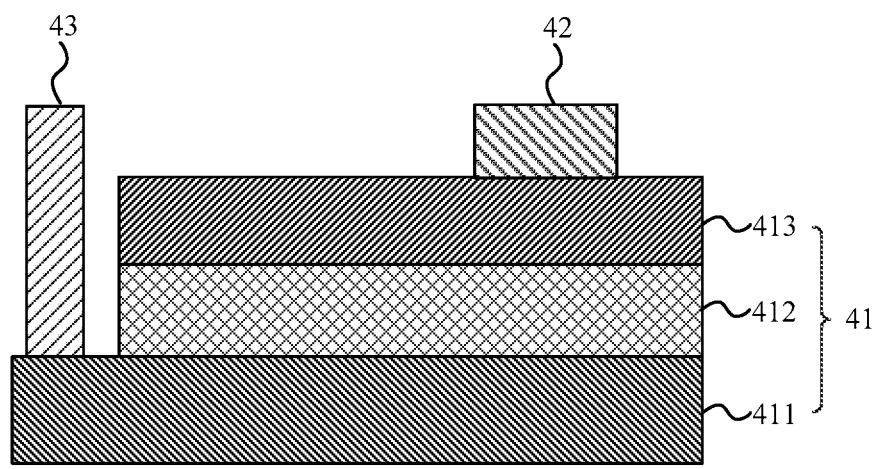
FIG. 10 is a structural view of another Micro LED according to embodiments of the present disclosure.

FIG. 10 is a structural view of a Micro LED provided in embodiments of the present disclosure. As shown in FIG. 10, the Micro LED provided by the present disclosure may be a Micro LED with a coplanar electrode structure. The Micro LED with coplanar electrode structure includes an LED semiconductor structure 41, and a first electrode 42 and a second electrode 43 located on the same side of the LED semiconductor structure 41. The LED semiconductor structure 41 includes a first type semiconductor layer 411, an active layer 412, and a second type semiconductor layer 413 stacked. In the manufacturing process of the first electrode 42 and the second electrode 43, as shown in FIG. 10, the first electrode 42 may be located on the surface of the second type semiconductor layer 413 backing onto the active layer 412. Then the second type semiconductor layer 413 and the active layer 412 may be etched to expose a portion of the first type semiconductor layer 411, the second electrode 43 may be formed on the surface, facing the active layer 412, of the first type semiconductor layer 411, and finally the Micro LED with the coplanar electrode structure may be formed.

In one embodiment of the present disclosure, the specific type of the first electrode is not limited, and the first electrode may be an N electrode, that is, a cathode, and correspondingly, the second electrode is a P electrode, that is, an anode; the first electrode may be a P electrode, that is, an anode, and the second electrode may be an N electrode, that is, a cathode. Meanwhile, the cathode and the anode of the Micro LED can be made of opaque metal materials or transparent conductive media. Even if the anode or the cathode of the Micro LED is made of an opaque metal material, the anode or the cathode of the Micro LEDs is not in a whole layer structure and can be arranged to be independent. Therefore, gaps among the Micro LEDs can transmit light, and the sensor can normally work. By way of example, to improve the light utilization rate of the sensor and make the sensor receive more ambient light, the Micro LEDs in embodiments of the present disclosure may also be transparent Micro LEDs, that is, each layer structure of the plurality of Micro LEDs 130 is formed by a transparent material. By way of example, the N-type semiconductor layer or the P-type semiconductor layer may be made of a transparent material such as gallium nitride or gallium arsenide. The first electrode and the second electrode may be made of transparent materials. In the present embodiments, the specific materials of the transparent materials forming the first electrode and the second electrode are not limited, and may be transparent conductive materials, such as ITO (indium tin oxide), IZO (indium zinc oxide), etc., or transparent ultrathin metal materials, such as silver nanowires (each having a thickness of less than 100 nm).

In one embodiment, since the second pixel units 22 disposed in the second display area 12 are OLED pixel units, in order to ensure that the OLED pixel units work normally and are protected from water and oxygen corrosion, the display panel provided by the present disclosure may further include an encapsulation layer located between the first substrate 13 and the second substrate 14. The water and oxygen are blocked by the encapsulation layer, to ensure that the OLED pixel units work normally. In one embodiment, the encapsulation layer may be a rigid encapsulation layer or a thin film encapsulation layer. When the encapsulation layer is a thin film encapsulation layer, the thin film encapsulation layer may include a stacked structure of multiple inorganic layers and multiple organic layers.

Figure 11:
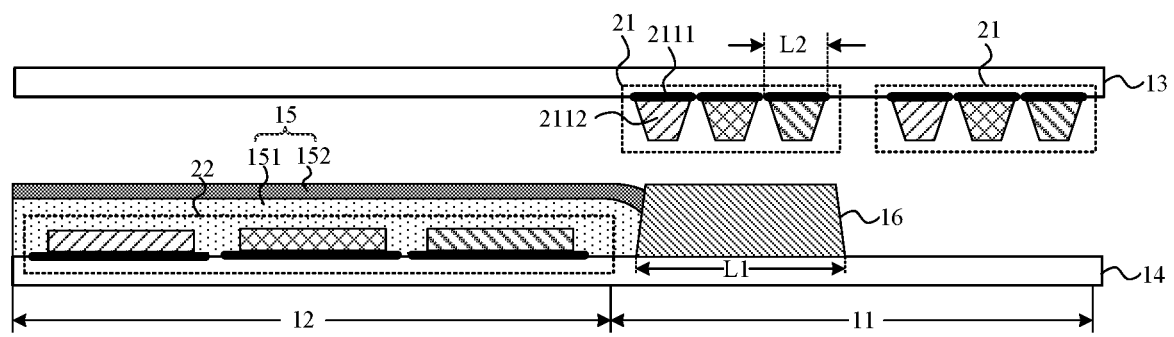
FIG. 11 is a cross-sectional view taken along a section line B-B' of the display panel shown in FIG. 7.

In one embodiment, FIG. 11 is a cross-sectional view of a display panel shown in FIG. 7 taken along the section line B-B'. As shown in FIG. 11, the display panel provided by the disclosure may further include a thin film encapsulation layer 15 between the first substrate 13 and the second substrate 14. The thin film encapsulation layer 15 covers the OLED pixel units located in the second display area 12, and the edge of the thin film encapsulation layer 15 extends to the first display area 11. The display panel may further include a blocking structure 16 located on one side, adjacent to the second display area 12, of the first display area 11 and located on one side, facing the first substrate 13, of the second substrate 14. The first driving circuit 2111 on the side adjacent to the second display area 12 is located on the side, facing the second substrate 14, of the first substrate 13.

Exemplarily, when the encapsulation layer is the thin film encapsulation layer 15, the thin film encapsulation layer 15 includes at least one organic layer and at least one inorganic layer, and FIG. 11 illustrates that the thin film encapsulation layer 15 includes an organic layer 151 and an inorganic layer 152. As shown in FIG. 11, the organic layer 151 is located at one side adjacent to the OLED pixel unit, and absorbs external water oxygen to provide water oxygen protection for the OLED pixel units. The inorganic layer 152 is located on one side backing onto the OLED pixel units to provide support protection for the OLED pixel units. The organic layer 151 and the inorganic layer 152 both cover the OLED pixel unit and extend to one side of the first display area 11 adjacent to the second display area 12. In addition, the display panel provided by the present disclosure further includes a blocking structure 16 located on one side of the first display area 11 adjacent to the second display area 12 and on one side of the second substrate 14 facing to the first substrate 13. The blocking structure 16 is used to block the thin film encapsulation layer 15, to prevent the thin film encapsulation layer 15 from extending toward the first display area 11 during a preparation process to affect normal display and normal light transmission of the first display area 11. Moreover, the organic layer 151 and the inorganic layer 152 are both arranged to extend to the first display area 11, and the blocking structure 16 is disposed on one side of the first display area 11 adjacent to the second display area 12. In one embodiment, a packaging reserved area for packaging the OLED pixel units is configured at the side of the first display area 11 facing to the second display area 12, so that the encapsulation effect is improved. In the another embodiment, the blocking structure 16 is disposed on one side, of the first display area 11 adjacent to the second display area 12 instead of being disposed in the second display area 12, so that the display area of the normal display area of the display panel can be increased, and the display effect of the display panel can be improved, to enable the OLED package edge area which cannot be displayed originally to realize normal display; in yet another embodiment, the blocking structure 16 is disposed on the side, adjacent to the second display area 12, of the first display area 11 instead of the first display area 11, so that the light-transmitting area in the first display area 11 is not affected, the first display area 11 has a better light transmission effect, the sensor can receive more light signals, and the sensor has a good using effect.

Further, the blocking structure 16 may include a single blocking structure, as shown in FIG. 11. A single blocking structure 16 is disposed on one side of the first display area 11 adjacent to the second display area 12 and on one side of the second substrate 14 facing to the first substrate 13. The single blocking structure 16 corresponds to one side of the first display area 11 facing to the second display area 12, and the arrangement mode of the blocking structure is simple. The Micro LED pixel units are configured on one side of the first substrate 13 facing to the second substrate 14, and the pixel unit density of the Micro LED pixel units is the same as the pixel unit density of the OLED pixel units in the second display area 12. Therefore, the first display area 11 can normally emit light and display on the side adjacent to the second display area 12, and the full-screen display of the display panel is realized. Meanwhile, the thin film encapsulation layer 15 can be encapsulated on one side of the first display area 11 adjacent to the second display area 12, so that the normal use of the OLED pixel units in the second display area 12 is ensured. In one embodiment, the single blocking structure 16 extends along the first direction by a width L1, and 50 µm≤L1≤500 µm; the extension width of the single Micro-LED is L1, and L1 is less than or equal to 15 µm, and the extension width of the blocking structure is larger than the extension width of the single micro-LED, so that the single blocking structure 16 can correspond to several or dozens of micro-LEDs. In one embodiment, a packaging reserved area for packaging the OLED pixel units is configured on one side of the first display area 11 adjacent to the second display area 12, so that the encapsulation effect is improved. In another embodiment, the blocking structure 16 is disposed on the side of the first display area 11 adjacent to the second display area 12 instead of the second display area 12, so that the display area of the normal display area of the display panel can be increased, and the display effect of the display panel can be improved, to enable the OLED package edge area which cannot be displayed originally to realize normal display; in yet another embodiment, the blocking structure 16 is disposed on the side, adjacent to the second display area 12, of the first display area 11 instead of the first display area 11, so that the light-transmitting area in the first display area 11 is not affected, the first display area 11 has a better light transmission effect, the sensor can receive more light signals, and the sensor has a good using effect.

It should be noted that the encapsulation effect of the second display area 12 is improved when a single blocking structure is provided, and the manufacturing process difficulty is also reduced, but the present disclosure is not limited to a single blocking structure, and two or more blocking structures (not shown in the figure) may be provided, and specifically, the blocking structures may be designed according to the actual display panel.

It should be noted that the thin film encapsulation layer 15 according to embodiments of the present disclosure may include a stacked structure of multiple organic layers and multiple inorganic layers, and embodiments of the present disclosure are only illustrated by examples in which the thin film encapsulation layer 15 includes the organic layer 151 and the inorganic layer 152. Similarly, the blocking structures 16 according to embodiments of the present disclosure may include at least one blocking structure. When the blocking structure 16 includes only one blocking structure, the blocking structure is used to block the organic layer 151 and the inorganic layer 152 from extending to the first display area 11 during the manufacturing process. When the blocking structures 16 include a plurality of blocking structures, the plurality of blocking structures may each be used to block the organic layer 151 from extending toward the first display area 11 during the manufacturing process; or a plurality of blocking structures are used to respectively block the organic layer 151 and the inorganic layer 152, which is not limited in embodiments of the present disclosure. FIG. 11 uses an example in which the blocking structure 16 includes a single blocking structure.

Similarly, in embodiments of the present disclosure, the first substrate 13 and the second substrate 14 may be both flexible substrates, and the first pixel unit 21 may be located on one side surface of the first substrate 13 backing onto the second substrate 14, The first pixel unit 21 may be attached on one side surface of the first substrate 13 on which the original is not disposed and on a light-emitting surface side of the second substrate 14. Therefore, the adhesive material may not be disposed on the surface of the first pixel unit 21, which is advantageous for heat dissipation of the first pixel unit 21. And in embodiments of the present disclosure, the area of the first substrate 13, that is, the substrate provided with the first pixel units 21, may be less than the area of the second substrate 14. Since the first substrate 13 serves only as a carrier substrate for the first pixel unit 21, the first substrate 13 may be sized to cover the first display area 11.

Figure 12:
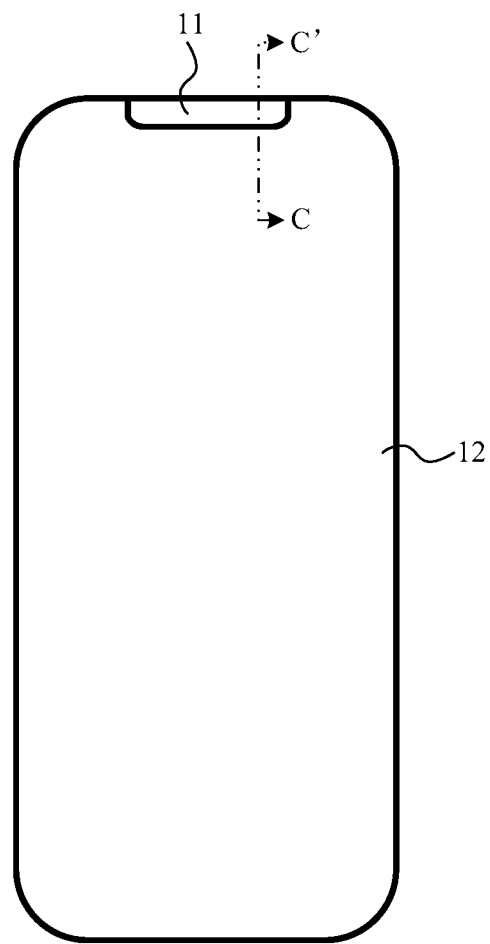
FIG. 12 is a top view of a display device according to embodiments of the present disclosure.
Figure 13:
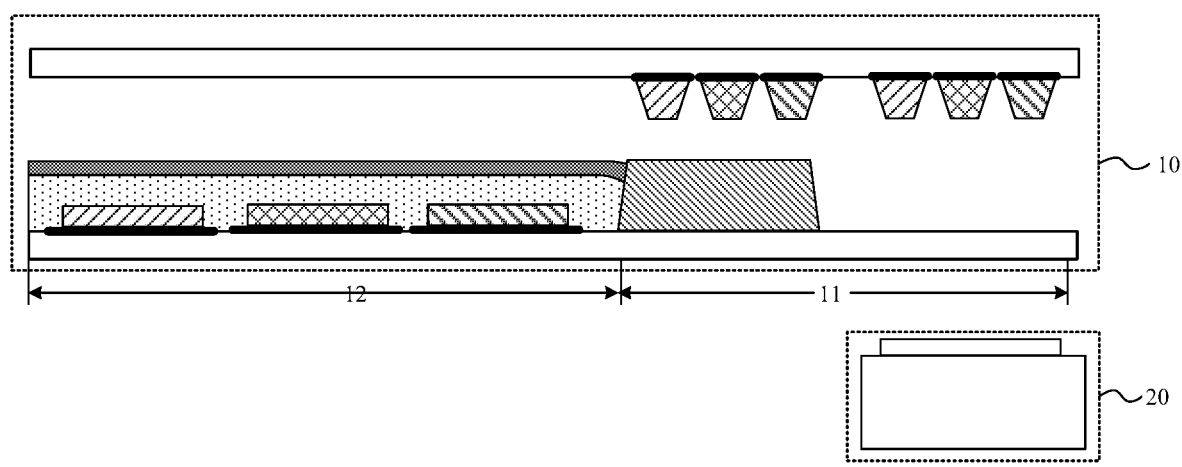
FIG. 13 is a cross-sectional view along a section line C-C' of the display panel shown in FIG. 12.

Based on the same inventive concept, embodiments of the present disclosure further provide a display device. FIG. 12 is a top view of the display device according to embodiments of the present disclosure, and FIG. 13 is a cross-sectional view of a display panel shown in FIG. 12 taken along section line C-C'. As shown in FIG. 12 and FIG. 13, a display device according to embodiments of the present disclosure includes a display panel 10 according to any embodiment of the present disclosure and a sensor 20. The display panel 10 includes a first display area 11 and a second display area 12, the first display area is reused as a sensor reserved area, and the sensor 20 is located in the sensor reserved area. In one embodiment, the sensor according to embodiments of the present disclosure may include one or more of a camera device, a photosensitive sensor, and an ultrasonic distance sensor. The display device may be a mobile phone as shown in FIG. 12, and may also be a computer, a television, an intelligent wearable display device, and the like, which is not particularly limited in embodiments of the present disclosure.

What is claimed is:

1. A display panel, comprising:
a first display area and a second display area, wherein the first display area is reused as a sensor reserved area;
wherein the first display area comprises a plurality of first pixel units, the second display area comprises a plurality of second pixel units, wherein the plurality of first pixel units comprise micro light-emitting diode pixel units, and the plurality of second pixel units comprise organic light-emitting diode pixel units;
wherein the first display area at least comprises a region in which a density of the plurality of first pixel units in the first display area is configured to be gradually decreased along a first direction, and wherein the first direction is a direction in which the second display area points to the first display area;
wherein the first display area comprises:
a plurality of pixel unit columns, the plurality of pixel unit columns comprise a first pixel unit column and a second pixel unit column, and the second pixel unit column is located on one side of the first pixel unit column facing away from the second display area, wherein the first pixel unit column and the second pixel unit column extend along a second direction, and wherein the second direction intersects the first direction;

along the second direction, each of the first pixel unit column and the second pixel unit column comprises a plurality of first pixel units arranged in a polyline pattern, and in a same pixel unit column of the plurality of pixel unit columns, adjacent two rows of first pixel units in the same pixel unit column are staggered by a first preset distance along the first direction, wherein each of the plurality of first pixel units comprises red green blue subpixels extend along the first direction; and along the first direction, an extension width of the first pixel unit column is d1, and an extension width of the second pixel unit column is d2, wherein d1<d2;

wherein each pixel unit column of the plurality of pixel unit columns comprises N sub pixel unit columns, and the N sub pixel unit columns extend along the second direction, wherein N is a positive integer greater than or equal to 2; and wherein the first pixel unit column comprises N1 sub pixel unit columns, the second pixel unit column comprises N2 sub pixel unit columns, wherein N2 is greater than N1, and the difference between N2 and N1 is equal to 1.

2. The display panel of claim 1, wherein different sub pixel unit columns in the same pixel unit column are electrically connected to different data lines.

3. The display panel of claim 1, wherein the first pixel unit column is electrically to N1 data lines, the second pixel unit column is electrically to N2 data lines, and one of the N1 data lines is electrically connected to a respective one of the N1 sub pixel unit columns, and one of the N2 data lines is electrically connected to a respective one of the N2 sub pixel unit columns.

4. The display panel of claim 2, wherein along the second direction, the N sub pixel unit columns in a same pixel unit column share one of data lines with the plurality of second pixel units in the second display area.

5. The display panel of claim 1, wherein the first pixel units in each pixel unit column are arranged in the polyline pattern, and the first pixel units in each of the N sub pixel unit columns are arranged along a straight line in the second direction.

6. The display panel of claim 1, wherein along the first direction, the first preset distance is d3 and an extension width of each of the plurality of second pixel units is d4, wherein d3=d4.

7. The display panel of claim 1, wherein the first display area comprises at least two first pixel unit columns and at least two second pixel unit columns in sequence along the first direction.

8. The display panel of claim 1, wherein the first display area comprises a plurality of pixel unit columns, and distances between adjacent two pixel unit columns in the plurality of pixel unit columns gradually increase along the first direction.

9. The display panel of claim 1, wherein the first display area comprises:
a pixel unit density fixing area, wherein the pixel unit density fixing area is spaced apart from the second display area; the pixel unit density fixing area has a uniform pixel unit density, and a pixel unit density of the pixel unit density fixing area is smaller than a pixel unit density of the second display area.

10. The display panel of claim 9, wherein the first display area further comprises:
a pixel unit transition area disposed between the pixel unit density fixing area and the second display area; and wherein along the first direction, an extension width of the pixel unit transition area is d5, and an extension width of the pixel unit density fixing area is d6, wherein 0.01≤d5/d6≤100.

11. The display panel of claim 1, wherein a pixel unit density of pixel units disposed one side of the first display area adjacent to the second display area is the same as a pixel unit density of pixel units disposed in the second display area.

12. The display panel of claim 1, wherein the display panel further comprises a first substrate and a second substrate disposed opposite to the first substrate, wherein
in the first display area, a first driving circuit and a plurality of micro light-emitting diodes are configured on one side of the first substrate facing to the second substrate or one side of the second substrate facing to the first substrate, and the first driving circuit is used for driving the plurality of micro light-emitting diodes to emit light; and
in the second display area, a second driving circuit and a plurality of organic light-emitting diodes are arranged on one side of the second substrate facing to the first substrate, and the second driving circuit is used for driving the plurality of organic light-emitting diodes to emit light.

13. The display panel of claim 12, further comprising:
a thin film encapsulation layer disposed between the first substrate and the second substrate, wherein the organic light-emitting diode pixel units located in the second display area are covered by the thin film encapsulation layer, and an edge of the thin film encapsulation layer extends to the first display area; and wherein the display panel further comprises a blocking structure, wherein the blocking structure is disposed on one side of the first display area adjacent to the second display area and on one surface of the second substrate facing to the first substrate; wherein the first driving circuit adjacent to one side of the second display area is disposed on one side of the first substrate facing to the second substrate.

14. A display device, comprising:
a display panel, and a sensor located in a sensor reserved area; wherein the display panel comprises: a first display area and a second display area, wherein the first display area is reused as the sensor reserved area;
wherein the first display area comprises a plurality of first pixel units, the second display area comprises a plurality of second pixel units, wherein the plurality of first pixel units comprise micro light-emitting diode pixel units, and the plurality of second pixel units comprise organic light-emitting diode pixel units;
wherein the first display area at least comprises a region in which a density of the plurality of first pixel units in the first display area is configured to be gradually decreased along a first direction, and wherein the first direction is a direction in which the second display area points to the first display area;
wherein the first display area comprises:
a plurality of pixel unit columns, the plurality of pixel unit columns comprise a first pixel unit column and a second pixel unit column, and the second pixel unit column is located on one side of the first pixel unit column facing away from the second display area, wherein the first pixel unit column and the second pixel unit column extend along a second direction, and wherein the second direction intersects the first direction;
along the second direction, each of the first pixel unit column and the second pixel unit column comprises a plurality of first pixel units arranged in a polyline pattern, and in a same pixel unit column of the plurality of pixel unit columns, adjacent two rows of first pixel units in the same pixel unit column are staggered by a first preset distance along the first direction, wherein each of the plurality of first pixel units comprises red green blue subpixels extend along the first direction; and
along the first direction, an extension width of the first pixel unit column is d1, and an extension width of the second pixel unit column is d2, wherein d1<d2;
wherein each pixel unit column of the plurality of pixel unit columns comprises N sub pixel unit columns, and the N sub pixel unit columns extend along the second direction, wherein N is a positive integer greater than or equal to 2; and
wherein the first pixel unit column comprises N1 sub pixel unit columns, the second pixel unit column comprises N2 sub pixel unit columns, wherein N2 is greater than N1, and the difference between N2 and N1 is equal to 1.

15. The display device of claim 14, wherein the sensor comprises at least one of a camera device, photosensitive sensor and an ultrasonic distance sensor.

16. A display panel, comprising:
a first display area and a second display area, wherein the first display area is reused as a sensor reserved area;
wherein the first display area comprises a plurality of first pixel units, the second display area comprises a plurality of second pixel units, wherein the plurality of first pixel units comprise micro light-emitting diode pixel units, and the plurality of second pixel units comprise organic light-emitting diode pixel units;
wherein the first display area at least comprises a region in which a density of the plurality of first pixel units in the first display area is configured to be gradually decreased along a first direction, and wherein the first direction is a direction in which the second display area points to the first display area;
wherein the first display area comprises:
a plurality of pixel unit columns, the plurality of pixel unit columns comprise a first pixel unit column and a second pixel unit column, and the second pixel unit column is located on one side of the first pixel unit column facing away from the second display area, wherein the first pixel unit column and the second pixel unit column extend along a second direction, and wherein the second direction intersects the first direction;
along the second direction, each of the first pixel unit column and the second pixel unit column comprises a plurality of first pixel units arranged in a polyline pattern, and in a same pixel unit column of the plurality of pixel unit columns, adjacent two rows of first pixel units in the same pixel unit column are staggered by a first preset distance along the first direction, wherein each of the plurality of first pixel units comprises red green blue subpixels extend along the first direction; and
along the first direction, an extension width of the first pixel unit column is d1, and an extension width of the second pixel unit column is d2, wherein d1<d2;
wherein along the first direction, the first preset distance is d3 and an extension width of each of the plurality of second pixel units is d4, wherein d3=d4, so that blank rows and blank columns do not exist in the first pixel unit column and the second pixel unit column.

17. The display panel of claim 16, wherein each pixel unit column of the plurality of pixel unit columns comprises N sub pixel unit columns, and the N sub pixel unit columns extend along the second direction, wherein N is a positive integer greater than or equal to 2.

18. The display panel of claim 17, wherein the first pixel unit column comprises N1 sub pixel unit columns, the second pixel unit column comprises N2 sub pixel unit columns, and wherein N2 is greater than N1.

19. The display panel of claim 16, wherein the first pixel unit column is electrically to N1 data lines, the second pixel unit column is electrically to N2 data lines, and one of the N1 data lines is electrically connected to a respective one of the N1 sub pixel unit columns, and one of the N2 data lines is electrically connected to a respective one of the N2 sub pixel unit columns.

20. The display panel of claim 16, wherein the first pixel units in each pixel unit column are arranged in the polyline pattern, and the first pixel units in each of the N sub pixel unit columns are arranged along a straight line in the second direction.

* * * * *